Oct. 9, 1973 H. W. GLICK ET AL 3,764,511

MOATED SUBSTRATE-HOLDING PEDESTAL

Filed March 29, 1972

United States Patent Office 3,764,511

Patented Oct. 9, 1973

3,764,511
MOATED SUBSTRATE-HOLDING PEDESTAL

Herbert W. Glick, West Hartford, and Daniel H. Grantham, Glastonbury, Conn., assignors to United Aircraft Corporation, East Hartford, Conn.

Filed Mar. 29, 1972, Ser. No. 239,249
Int. Cl. C23c 15/00
U.S. Cl. 204—298 1 Claim

ABSTRACT OF THE DISCLOSURE

In an RF sputtering system, an electrode has pedestals for holding silicon wafers upon which the sputtered material is to be deposited. The pedestals are formed in a large conductive block with heating, cooling and temperature monitoring means, thereby to control the temperature of the wafers during the sputtering process. The disclosed improvement comprises an annular moat near the extremity of the wafer-mounting surface of the pedestal, which traps material, such as vacuum grease or gallium, used to thermally secure the wafer to the pedestal, which tends to erupt or spatter during the vacuum deposition process; the trapping of the material prevents its lodging on the surfaces of wafers when being processed.

BACKGROUND OF THE INVENTION

Field of invention

This invention relates to improvements in the mounting of silicon wafers during RF sputtering and other processes.

Description of the prior art

With the increasing need for more sophisticated electronic systems stressing high reliability and small size, medium (MSI) and large (LSI) scale integrated semiconductor arrays are being considered as the next practical phase in the electronics industry. The realization of MSI and LSI arrays requires the development of multilevel interconnection systems compatible with semiconductor processing and materials. Fundamental to this concept is the need for high quality insulating and conducting thin films. Conductor continuity, low ohmic resistance, high dielectric strength, freedom from unwanted short circuits, and simple and reproducible processing techniques are some of the considerations requiring attention in order to produce such an interconnection system. The task is indeed complex and involves a multiplicity of interrelated phenomena dependent upon the processes chosen.

Specific consideration with regard to the production of high quality insulating films reveals the need for uniformity in thickness, etch rate, density, composition, dielectric strength and reproducibility of deposition rate and film properties. Elimination of pinholes and detrimental effects on the underlying structure are also of primary importance. It has been found that one of the key factors in obtaining a satisfactory deposition process is temperature control. Specifically, high temperatures degrade the quality of the underlying metal structures by accelerating and promoting whisker or dendritic growths. Low temperatures generally result in unsatisfactory insulating film properties such as poor stoichiometry, and etch rates. Uncontrolled temperature generally produces uncontrolled results.

To facilitate the control over the temperature of a substrate or wafer upon which material is to be deposited, thermally conductive material, such as copper, is utilized as a wafer-mounting anode. To facilitate loading and unloading wafers from their mountings, it has been known to use round pedestals which raise the wafers above the general surface of the anode, and which act as thermal sinks. Application of a coolant through a plurality of passageways in the thermal sink, as well as in application of heat by means of an electric heater, permits providing any desired temperature. Usually, a thermocouple is mounted within one pedestal so as to provide an indication of the temperature of the wafers during processing. Typically several pedestals may permit the processing of several wafers at one time. Because of the vacuum conditions present during the sputtering deposition process and the general surface roughness of materials, the deposition substrates are effectively isolated from their thermal sink (except for radiation effects) and therefore are not amenable to thermal control unless special precautions are taken. These precautions usually take the form of applying some type of thermally conducting or adhesive media to the substrate/sink interfaces. Such materials must be compatible with the vacuum and thermal environment. Gallium and certain vacuum greases have been successfully used in this application.

We have discovered that poor deposition frequently results from particles of contamination material, which first appear on the surface of the substrate during the deposition process. We have further discovered that one source of surface contamination is particles of the material used to form a good thermal conductive bond between the substrate and the heat sink. We also have found that the thermal materials erupt violently during the vacuum pump down and heat-up cycle. Although this phenomenon is not fully understood, it is believed possible that gas particles may be trapped in the interface between the substrate and the pedestal surface, and the subsequent heating causes rapid expansion of the gas giving an explosive effect; on the other hand, it may possibly be due to the very low pressures involved. As a result, the thermal bond material (gallium or a vacuum grease, hereinafter referred to thermal material) erupts outwardly from the substrate/pedestal interface and spatters against surrounding surfaces and eventually onto the surfaces of the wafers upon which material is being deposited. The specks of thermal material act just as does a speck of dust or other foreign matter on the surface. It prevents the deposition of the desired material into the region occupied by the thermal material. In the case of deposition of silicon dioxide, the silicon dioxide will surround the foreign material; then, through later handling, the foreign material becomes dislodged and leaves a pinhole through the surface which can cause short circuiting of subsequent layers of metallization. Similarly, this problem can result in lack of uniformity of resistance of conductive layers.

SUMMARY OF INVENTION

The primary object of the present invention is to contain thermal materials used to produce a good thermal conductivity between a substrate and a substrate-mounting thermal sink.

According to the present invention, a thermal sink in the form of a pedestal, to which a substrate is to be disposed with good thermal conductivity, is provided with an annular moat to entrap material used in a substrate-sink interface to provide a good termal bond therein.

The invention permits RF sputtering, and other deposition processes, to be carried out, without surface contamination as a result of spattering of thermal material used to enhance the thermal conductivity in the substrate/sink interface.

Other objects, features and advantages of the present invention will become more apparent in the light of the following detailed description of a preferred embodiment thereof, as illustrated in the accompanying drawing.

DESCRIPTION OF THE PREFERRED EMBODIMENT

Figures 1, 2:
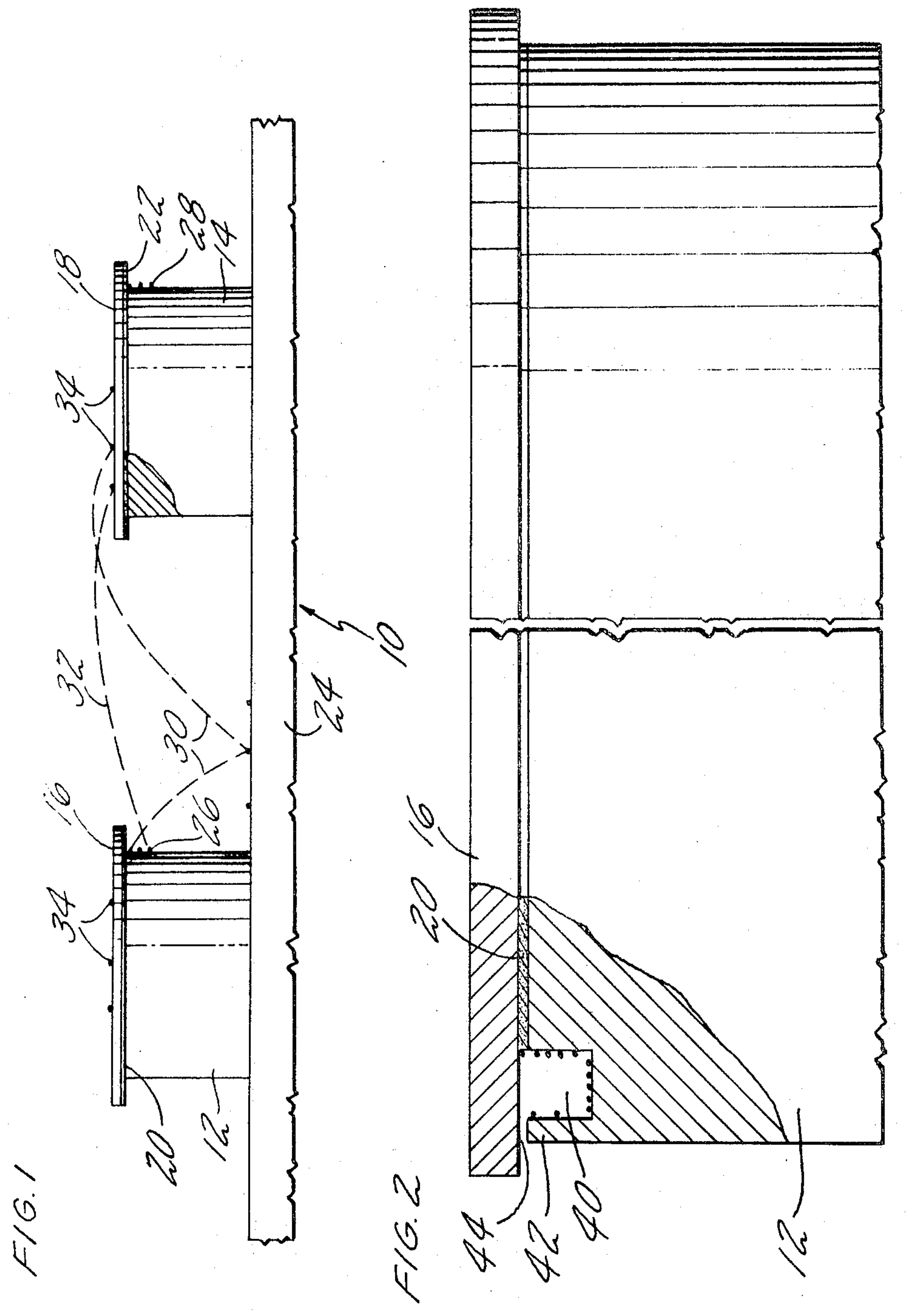
FIG. 1 is a partial side elevation view of thermal sink pedestals known to the prior art.
FIG. 2 is a partially sectioned, partially broken away side elevation view of a thermal sink pedestal incorporating the present invention.

Substrate mounting pedestals of the type referred to with respect to the prior art hereinbefore are illustrated in FIG. 1. Therein, an electrode 10 includes a plurality of solid cylindrical pedestals 12, 14, each adapted to have a substrate 16, 18 secured thereon with a layer of material 20, 22 between the surfaces of the wafers 16, 18 and the pedestals 20, 22. The electrode also comprises a large bulk of highly conductive material 24, which may comprise copper or other thermally conductive material, to act as a heat sink. As is known, coolant passages and heating elements may be provided so as to be able to accurately control the temperature; in addition, one of the pedestals 12, 14 may have a thermal couple embedded therein to provide an indication of the temperature of the substrates 16, 18 during the deposition process. The electrode 10 may be used as the electrode of an RF sputtering system of the type disclosed in Grantham et al., U.S. Pat. No. 3,595,775, or in other systems.

This invention is predicated on our discovery that particles of the thermal material 20, 22 are violently ejected from the region between the surface of the pedestals 12, 14 and the substrates 16, 18, as well as from some of the material (as at 26, 28) which drips out of the interface. The material may follow a number of paths 30, 32 and result in specks, or particles, 34 on the surface of the substrate upon which material is to be deposited.

To overcome this problem, the present invention provides an annular moat 40, completely circumscribing the major portion of the surface of the pedestal 12. An annular ring 42, which forms the outside surface of the moat 40 is designed to almost completely seal off the moat 40 from the outside, so that there is a near impossibility of any material passing through an annular slot 44 formed between the annular ring 42 and the lower surface of the substrate 16. The moat should be designed with respect to the size of the wafer or substrate so that a maximum amount of thermal material 20 may be across the circular surface subscribed by the moat for good thermal conductance between the pedestal 12 and the substrate 16. On the other hand, it should have sufficient width (radially) so as to prevent any of the thermal material spread on the back of the wafer from reaching the annular ring 42 as a result of massaging the wafer to the pedestal 12.

One feature of the invention is that it confines the thermal material to a well defined region from which it cannot spatter onto surfaces of wafers or substrates being processed, without the use of any superficial surfaces which could partially enclose the upper surface of the substrate 16 and thereby hinder the deposition process. The invention permits mounting the wafers in any desired orientation, including that as shown in FIG. 2, or vertically or upside down, if desired. Mounting of wafers with thermal material is facilitated since great care need not be used in mounting a wafer to a pedestal when the pedestal includes the moat in accordance with the present invention.

The invention is equally applicable to a variety of processes including RF sputtering deposition, evaporation deposition, glow discharge cleaning, desputtering and so forth.

Although the invention has been shown and described with respect to a preferred embodiment thereof, it should be understood by those skilled in the art that various changes and omissions in the form and detail thereof may be made therein without departing from the spirit and the scope of the invention.

CLAIM

Having thus described a typical embodiment of our invention, that which we claim as new and desire to secure by Letters Patent of the United States is:

1. In an RF sputtering apparatus, a substrate holder electrode having a general plane and a plurality of cylindrical substrate mounting pedestals extending outwardly of said plane,
each of said cylindrical substrate mounting pedestals having an annular moat formed near the periphery of an outward end surface thereof,
each of said moats circumscribing a circular substrate mounting surface.

References Cited

UNITED STATES PATENTS 3,661,761 5/1972 Koenig ............ 204—298

JOHN H. MACK, Primary Examiner

S. S. KANTER, Assistant Examiner

U.S. Cl. X.R.

118—49